United States Patent [19]

Hofer

[11] 4,296,381

[45] Oct. 20, 1981

[54] DISTORTION REDUCTION CIRCUIT FOR AN INVERTING FEEDBACK AMPLIFIER

[75] Inventor: Bruce E. Hofer, Beaverton, Oreg.

[73] Assignee: Tektronix, Inc., Beaverton, Oreg.

[21] Appl. No.: 80,711

[22] Filed: Oct. 1, 1979

[51] Int. Cl.³ ............................................. H03D 1/00
[52] U.S. Cl. ...................................... 330/149; 330/9; 330/69
[58] Field of Search .............................. 330/149, 69, 9

[56] References Cited

U.S. PATENT DOCUMENTS 2,730,573  1/1956  Sedgfield et al. ........................ 330/9
3,462,697  8/1969  Gilbert ..................................... 330/9

OTHER PUBLICATIONS

McFadden, M. H., "Drift-Corrected D.C. Amplifier," *Electronic & Radio Engineer*, Oct. 1957, pp. 358–364.

*Primary Examiner*—Alfred E. Smith
*Assistant Examiner*—T. N. Grigsby
*Attorney, Agent, or Firm*—George T. Noe

[57] ABSTRACT

An amplifier is connected between the inverting and non-inverting inputs of an inverting feedback amplifier to substantially reduce distortion caused by inherent physical properties of the semiconductor devices.

3 Claims, 3 Drawing Figures

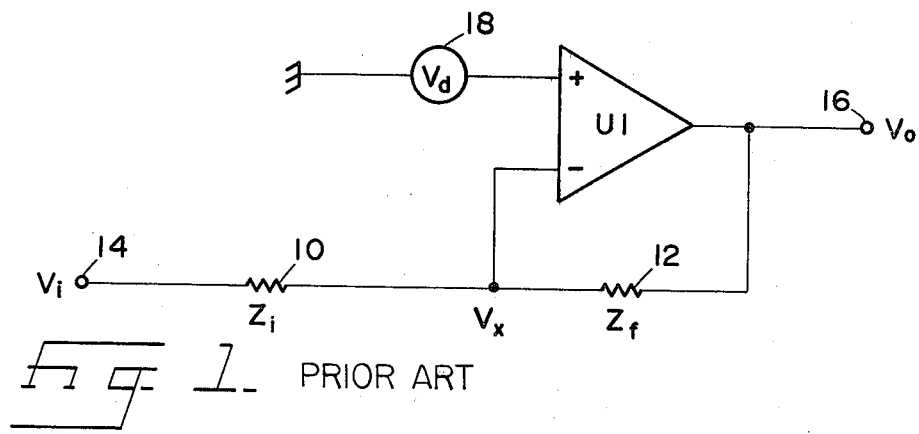
_Fig. 1_ PRIOR ART
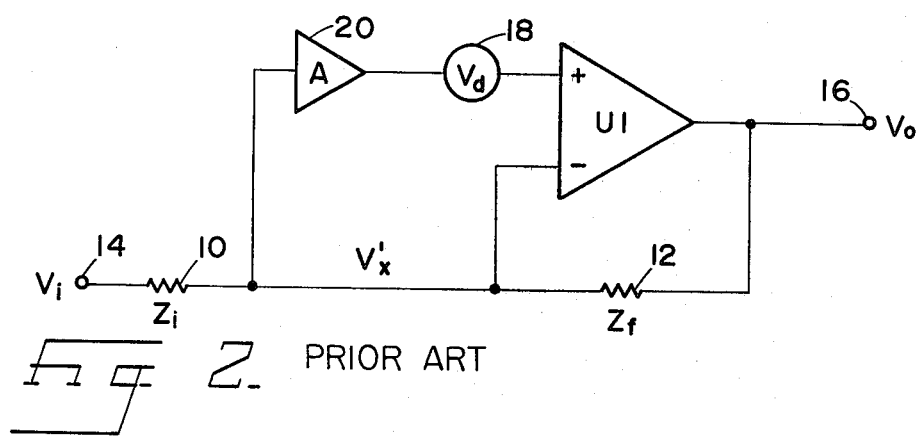
_Fig. 2_ PRIOR ART
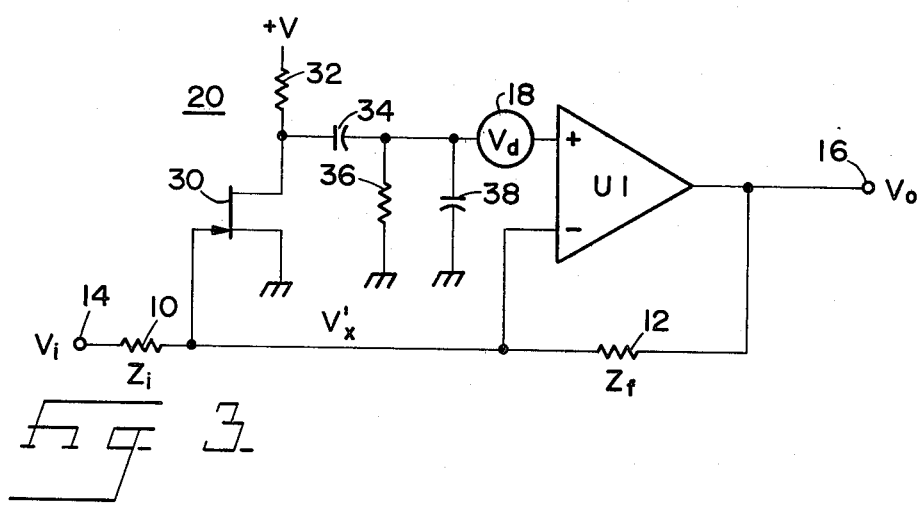
_Fig. 3_

DISTORTION REDUCTION CIRCUIT FOR AN INVERTING FEEDBACK AMPLIFIER

BACKGROUND OF THE INVENTION

Inverting feedback amplifiers are very popular and are widely used in the design of state-of-the-art electronic test and measurement equipment. The popularity of such amplifiers is attributable in part to their accurate gain characteristics coupled with simplicity of the amplifier itself. Implementation into a circuit is a matter of selecting appropriate external resistors in many cases. However, the active devices employed in inverting feedback amplifiers exhibit an inherent non-linear distortion and input noise characteristic which is a problem in designing signal-generating test equipment in which an extremely high degree of signal purity is desired. Most attempts to solve this problem have been to add compensating networks directly within the structure of the active devices themselves.

SUMMARY OF THE INVENTION

In accordance with the present invention, a distortion reduction circuit it provided for an inverting feedback amplifier, so that the inherent distortion is significantly reduced rather than compensated for. The distortion reduction circuit comprises an additional amplifier stage externally connected between the inverting input and the ordinarily grounded non-inverting input of the feedback amplifier to reduce the apparent magnitude of error voltage at the inverting input, consequently reducing the effects of inherent distortion or noise on the output signal.

It is therefore one object of the present invention to provide a novel distortion reduction circuit for an inverting feedback amplifier.

It is another object to reduce non-linear distortion in an inverting feedback amplifier by addition of simple external circuitry.

Other objects and advantages of the present invention will become apparent to those having ordinary skill in the art when taken in conjunction with the accompanying drawings.

BRIEF DESCRIPTION OF THE DRAWINGS

FIG. 1 is a conventional inverting feedback amplifier with the voltage distortion resulting from inherent physical properties modeled as an external voltage generator;

FIG. 2 shows an inverting feedback amplifier with a distortion reduction circuit in accordance with the present invention; and FIG. 3 shows the details of the distortion reduction circuit.

DETAILED DESCRIPTION OF THE INVENTION

Referring to FIG. 1, a conventional inverting feedback amplifier including an active device U1, an input impedance element, such as a resistor 10, and a feedback impedance element, such as a resistor 12, is shown. An input voltage $V_i$ is applied to an input terminal 14, and an output voltage $V_o$ is available at an output terminal 16. The active device U1, shown with inverting (−) and non-inverting (+) inputs, may be any of the well-known amplifier devices that are available, from a simple grounded emitter transistor to a sophisticated differential amplifier integrated circuit. All of these devices exhibit an inherent non-linear characteristic and noise which arise out of the physical properties of semiconductor devices. Distortion of voltage $V_d$ that is generated as a result of such non-linearities and noise is modeled by interposing a voltage generator 18 between ground and the non-inverting input of amplifier U1. Because the inverting and non-inverting inputs tend to remain balanced through operational amplifier action, a summing-point voltage $V_x$ which is approximately equal to distortion voltage $V_d$ is produced at the inverting input of U1.

FIG. 2 shows a modification to the circuit of FIG. 1 to reduce the effects of non-linear distortion and noise. Here, the basic inverting operational amplifier is substantially the same as shown in FIG. 1, and thus like reference numerals are used to facilitate the discussion. An amplifier 20 having a gain A is connected between the inverting and non-inverting inputs of U1 to establish a relationship between distortion voltage $V_d$ and a resulting summing-point voltage $V'_x$ in which $V_d \gg V'_x$. Since distortion voltage $V_d$ is generated by intrinsic physical properties at the non-inverting input, its value is not altered by amplifier 20. Therefore, amplifier 20 forces a reduction in summing-point voltage $V'_x$ by a factor of $1/(1+A)$ so that $V'_x \approx V_d/(1+A)$, consequently reducing distortion or noise in the output signal $V_o$. Considering that present state-of-the-art amplifier devices suitable for use as U1 exhibit very low distortion, the circuit of FIG. 2 reduces the low distortion to even lower levels. One embodiment of the present invention has been designed and tested in which the total distortion is less than 0.0001%.

The circuit of FIG. 3 is substantially the same as that of FIG. 2 and like reference numerals are used; however, the details of amplifier 20 are shown. The amplifier comprises a field-effect transistor (FET) 30 having its gate connected to the operational amplifier summing point at the inverting input of amplifier U1. Because of the high gate impedance of FET 30, the loading of the summing point by the implementation of amplifier 20 is minimized. The source of FET 30 is connected to ground, while the drain therefor is connected through a load resistor 32 to a source of positive voltage +V. The drain of FET 30 is also coupled to the non-inverting input of amplifier U1. An AC-coupling capacitor 34 is optional and may be included to provide a low-frequency cutoff, or to reduce the effects of drift at the drain of the FET. A resistor 36 from the non-inverting input to ground may be provided if a coupling capacitor is employed to establish the biasing requirements of amplifier U1. A capacitor 38 may be provided from the non-inverting input as a practical matter to optimize frequency response, or even to provide high frequency cutoff. Factors to be considered in including these optional components, or selecting the values thereof, include the purpose for which the circuit is to be used, the characteristics of the devices, circuit stability, and bandwidth limits. By carefully selecting the bandwidth of amplifier 20, the stability of amplifier U1 is not affected or compromised.

It will be obvious to those skilled in the art that the distortion reduction circuit for an inverting operational amplifier described hereinabove may be implemented in many ways, and that many devices may be substituted in the described embodiments. The appended claims therefore cover all such changes and modifications as fall therewithin.

What I claim as being novel is:

1. An amplifier circuit, comprising:

an inverting feedback amplifier having inverting and non-inverting inputs and an output, an input impedance element connected to said inverting input, and a feedback impedance element connected from said output to said inverting input; and a distortion reduction amplifier comprising a field-effect transistor, the gate of which is directly connected to said inverting input of said feedback amplifier, and the drain of which is coupled to said non-inverting input of said feedback amplifier.

2. An amplifier in accordance with claim 1 wherein the source of said field-effect transistor is connected to ground.

3. An amplifier in accordance with claim 1 wherein said distortion reduction amplifier further comprises passive elements to limit the frequency response thereof.

* * * * *